United States Patent
Aritome

(10) Patent No.: US 7,474,560 B2
(45) Date of Patent: Jan. 6, 2009

(54) NON-VOLATILE MEMORY WITH BOTH SINGLE AND MULTIPLE LEVEL CELLS

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/507,408

(22) Filed: Aug. 21, 2006

(65) Prior Publication Data

US 2008/0043527 A1   Feb. 21, 2008

(51) Int. Cl.
    *G11C 11/34* (2006.01)
(52) U.S. Cl. .............................. 365/185.17; 365/185.24
(58) Field of Classification Search ............ 365/185.17, 365/185.24
    See application file for complete search history.

(56) References Cited

U.S. PATENT DOCUMENTS

| | | | |
|---|---|---|---|
| 6,191,975 B1 | 2/2001 | Shimizu et al. | |
| 6,252,803 B1 | 6/2001 | Fastow et al. | |
| 6,345,001 B1 | 2/2002 | Mokhlesi | |
| 6,522,580 B2 | 2/2003 | Chen et al. | |
| 6,643,187 B2 | 11/2003 | Mokhlesi | |
| 6,807,095 B2 * | 10/2004 | Chen et al. ............. | 365/185.02 |
| 6,859,397 B2 | 2/2005 | Lutze et al. | |
| 6,907,497 B2 | 6/2005 | Hosono et al. | |
| 6,975,537 B2 | 12/2005 | Lutze et al. | |
| 6,982,905 B2 | 1/2006 | Nguyen | |
| 6,994,063 B2 | 2/2006 | Murata | |
| 7,005,699 B2 | 2/2006 | Chen et al. | |
| 7,012,835 B2 | 3/2006 | Gonzalez et al. | |
| 7,020,017 B2 | 3/2006 | Chen et al. | |
| 7,023,733 B2 | 4/2006 | Guterman et al. | |
| 7,061,798 B2 | 6/2006 | Chen et al. | |
| 2004/0221897 A1 | 11/2004 | Mokhlesi | |
| 2005/0219896 A1 * | 10/2005 | Chen et al. ............. | 365/185.03 |
| 2006/0044908 A1 | 3/2006 | Ha | |
| 2007/0133249 A1 * | 6/2007 | Roohparvar ................ | 365/100 |
| 2007/0211537 A1 * | 9/2007 | Park et al. ............... | 365/185.22 |

* cited by examiner

*Primary Examiner*—Michael T Tran
(74) *Attorney, Agent, or Firm*—Brooks, Cameron & Huebsch, PLLC

(57) ABSTRACT

Memory arrays, and modules, devices and systems that utilize such memory arrays, are described as having a single level non-volatile memory cell interposed between and coupled to a select gate and a multiple level non-volatile memory cell. Various embodiments include structure, process, and operation and their applicability for memory devices and systems. In some embodiments, a memory array is described as including a number of select gates coupled in series to a number of single level non-volatile memory cells and a number of multiple level non-volatile memory cells, where a first select gate is coupled to a first single level non-volatile memory cell interposed between and coupled to the first select gate and a first multiple level non-volatile memory cell.

39 Claims, 7 Drawing Sheets

| | EVEN STRING OF 33 CELLS | | ODD STRING OF 33 CELLS | |
|---|---|---|---|---|
| | LOWER | UPPER | LOWER | UPPER |
| WL-32 (SLC) | 126 | | 127 | |
| WL-31 | 122 | 123 | 124 | 125 |
| WL-30 | 118 | 119 | 120 | 121 |
| WL-29 | 114 | 115 | 116 | 117 |
| WL-28 | 110 | 111 | 112 | 113 |
| ⋮ | ⋮ | ⋮ | ⋮ | ⋮ |
| WL-8 | 30 | 31 | 32 | 33 |
| WL-7 | 26 | 27 | 28 | 29 |
| WL-6 | 22 | 23 | 24 | 25 |
| WL-5 | 18 | 19 | 20 | 21 |
| WL-4 | 14 | 15 | 16 | 17 |
| WL-3 | 10 | 11 | 12 | 13 |
| WL-2 | 6 | 7 | 8 | 9 |
| WL-1 | 2 | 3 | 4 | 5 |
| WL-0 (SLC) | 0 | | 1 | |

*Fig. 6A*

| | EVEN STRING OF 33 CELLS | | ODD STRING OF 33 CELLS | |
|---|---|---|---|---|
| | LOWER | UPPER | LOWER | UPPER |
| WL-32 (SLC) | 124 | | 125 | |
| WL-31 | 120 | 126 | 121 | 127 |
| WL-30 | 116 | 122 | 117 | 123 |
| WL-29 | 112 | 118 | 113 | 119 |
| WL-28 | 108 | 114 | 109 | 115 |
| ⋮ | ⋮ | ⋮ | ⋮ | ⋮ |
| WL-8 | 28 | 34 | 29 | 35 |
| WL-7 | 24 | 30 | 25 | 31 |
| WL-6 | 20 | 26 | 21 | 27 |
| WL-5 | 16 | 22 | 17 | 23 |
| WL-4 | 12 | 18 | 13 | 19 |
| WL-3 | 8 | 14 | 9 | 15 |
| WL-2 | 4 | 10 | 5 | 11 |
| WL-1 | 2 | 6 | 3 | 7 |
| WL-0 (SLC) | 0 | | 1 | |

*Fig. 6B*

NON-VOLATILE MEMORY WITH BOTH SINGLE AND MULTIPLE LEVEL CELLS

TECHNICAL FIELD

The present invention relates generally to memory devices and, in particular, the present invention relates to non-volatile memory architecture.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As the performance and complexity of electronic systems increase, the requirement for additional memory in a system also increases. However, in order to continue to reduce costs of the system, the parts count must be kept to a minimum. This can be accomplished by increasing the memory density of an integrated circuit by utilizing technologies such as using a multiple level cell (MLC) in place of one or more single level cell (SLC). For example, MLC NAND flash memory is a cost-effective non-volatile memory.

MLCs take advantage of the analog nature of a traditional flash cell by assigning a bit pattern to a specific threshold voltage (Vt) range stored on the cell. This technology permits the storage of two or more bits per cell, in comparison to the one bit per cell stored on a SLC, the storage capability depending on the quantity of voltage ranges assigned to the cell and the stability of the assigned voltage ranges during the lifetime operation of the MLC.

For example, a MLC may be assigned four different voltage ranges of 200 mV for each range. A dead space of margin of 200 mV to 400 mV can be placed between each range to prevent the Vt distributions from overlapping. If the voltage stored on the cell is within the first range, the cell is storing a logical 11 state and can be considered the erased, or unprogrammed, state of the cell.

If a programming voltage exceeds a first potential threshold of a MLC and elevates the stored voltage in the cell such that it is within the second range, a lower page of the cell is storing a logical 10 state, which correlates with a one bit SLC going from a 1 erased state to a 0 programmed state. This can continue for as many ranges as the MLC has capacity for storing. For example, a two bit MLC can store elevated voltages in upper page ranges such that exceeding a second potential threshold can cause the cell to store a logical 00 programmed state and exceeding a third potential threshold can cause the cell to store a logical 01 programmed state. Hypothetically, as many levels as desired can be added to a MLC, so long as they remain stable during the operational lifetime of the non-volatile memory cell.

A current limitation on including additional levels on MLCs, however, is a coupling between gates along the same bit line. Such coupling can be induced by marked potential differences between adjacent gates. For example, a two bit MLC having stored voltage in a range sufficient to result in an upper page 01 logical state can couple with an adjacent select gate having a lower potential (e.g., at ground level). Such coupling can cause current leakage that results in lowering voltage stored in a MLC into a range of a different logical state and consequent errors in reading the stored data.

BRIEF DESCRIPTION OF THE DRAWINGS

FIGS. 6A-6B illustrate operational tables for programming sequences that can be implemented with the non-volatile memory array architecture in accordance with embodiments of the present disclosure.

DETAILED DESCRIPTION

Figure 1:
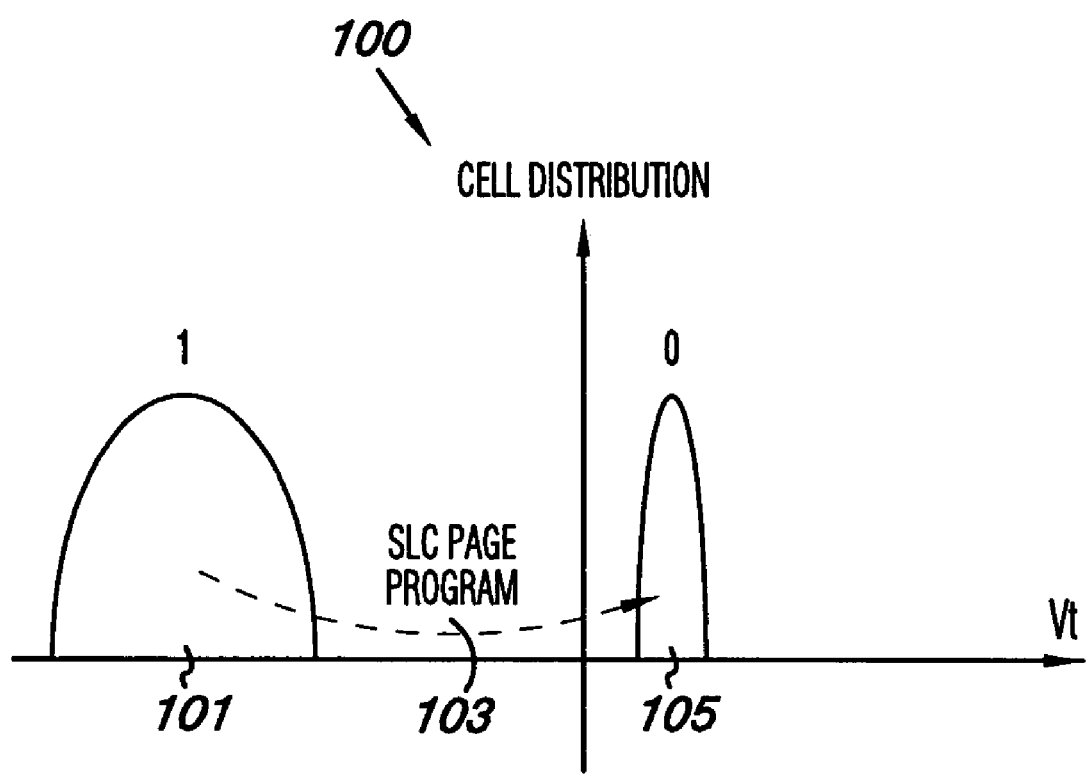
FIG. 1 is a threshold voltage distribution for a single level non-volatile memory cell and a result of a single level cell page programming.

The present disclosure includes various arrays, devices, systems, and methods for non-volatile memory with both single and multiple level cells. In one embodiment a memory array is provided having a number of single level non-volatile memory cells (SLCs) and a number of multiple level non-volatile memory cells (MLCs). A number of select gates are coupled in series to the number of single level non-volatile memory cells and the number of multiple level non-volatile memory cells. A first select gate is coupled to a first single level non-volatile memory cell interposed between and coupled to the first select gate and a first multiple level non-volatile memory cell. The first multiple level non-volatile memory cell is directly coupled to a continuous number of additional multiple level non-volatile memory cells.

According to various embodiments, non-volatile memory block uniformity is maintained by adding one or more additional word lines (WLs) to account for the SLCs separating the MLCs from the select gates. In one example embodiment, one SLC separates a continuous string of two (2)-bit MLCs from a source select gate (SGS) and another SLC separates the continuous string of MLCs from a drain select gate (SGD) and one additional word line is provided to maintain uniformity to a particular memory block size.

For example, uniformity to a particular memory block size of 128 pages may be desired. In this instance, thirty three (33)

word lines are provided, e.g., WL-0 through WL-32, with WL-0 being coupled to the SLC separating the SGS from the string of MLCs on one end of the string and WL-32 being coupled to the SLC separating the SGD from the string of MLCs on the other end of the string. In this example embodiment, thirty one (31) MLCs, associated with WL-1 through WL 31, are connected in series between the two SLCs. As such, each string provides a selection of 128 logical programmed states, corresponding to 64 bits of storable memory on each string. A selection between two or more logical programmed states can constitute a bit of storable memory (including an erase state), which can be termed a page when stored in a non-volatile memory array architecture in accordance with embodiments of the present disclosure. In various embodiments, to provide a memory block size of 128 pages, an even string and an odd string, each having 33 cells as described above, can be arrayed in association with WL-0 through WL-32. Embodiments in accordance with the present disclosure, however, are not limited to this example.

In the following detailed description the terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and equivalents thereof.

As used herein the term "electrically connected" is intended to imply an ability to directly connect an electrical current between at least two electrically conducting materials. And, as used herein, "electrically conducting material(s) and/or layer(s)" is intended to include doped and un-doped semiconductor materials. Further, as used herein, "electrically coupled" or "coupled" are intended to refer to at least one electrically conductive or conducting material and/or layer's ability to electrically influence (e.g., influencing the electrical state or behavior of) a neighboring electrically conducting material through capacitive coupling or otherwise, whether or not the two electrically conducting materials and/or layers are separated by an insulator or dielectric material. As one of ordinary skill in the art will appreciate, a "dielectric material and/or layer" is a material and/or layer that does not directly conduct electrical current.

FIG. 1 is a threshold voltage distribution for a single level non-volatile memory cell and a result of a single level cell page programming. FIG. 1 illustrates the threshold voltage (Vt) distribution 100 movement resulting from a selected SLC programming. In SLC programming, a cell is either in a logical "1" state 101 or, through use of a SLC page program 103, or algorithm, can be programmed to a logical "0" state 105. In some embodiments, the logical "1" state can be defined as an unprogrammed or erased state. As such, using the SLC page program 103 to increase the threshold voltage Vt sufficiently to cause the SLC to store a programmed threshold voltage 105 can result in the SLC converting from an erased logical 1 state to a programmed logical 0 state.

Figure 2A:
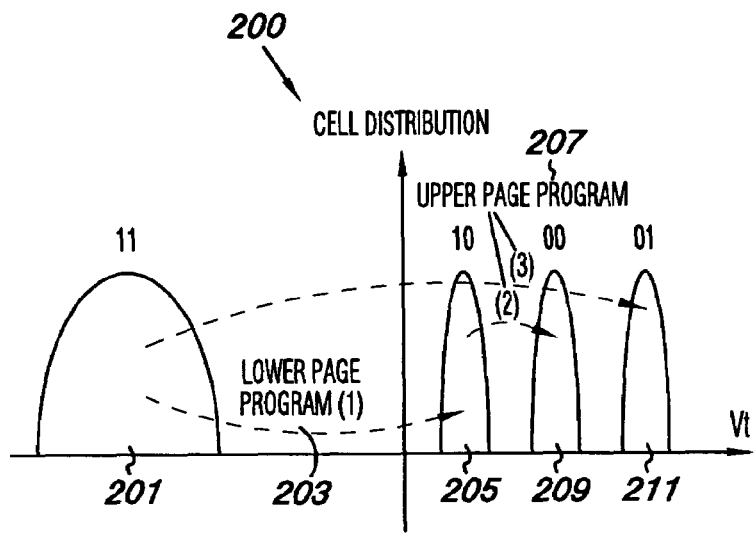
FIGS. 2A-2B are threshold voltage distributions for multiple level non-volatile memory cells and results of lower and upper page programming.

FIG. 2A is a threshold voltage distribution for a multiple level non-volatile memory cell and results of lower and upper page programming. FIG. 2A illustrates the Vt distribution 200 movements resulting from a selected MLC programming. A MLC algorithm can have three or more possible Vt movements resulting from supplied program data input. The embodiment illustrated in FIG. 2A can experience three possible Vt movements from a logical "11" erased state 201. A first movement (1) can use a lower page program 203, similar to SLC programming, to raise the stored threshold voltage from the logical "11" erased state 201 to a logical "10" programmed state 205.

In the MLC embodiment of FIG. 2A, an upper page program 207 has two possible Vt movements based on storage of elevated threshold voltage in distinct ranges. A second movement (2) is from the lower page "10" programmed state 205 to an upper page "00" programmed state 209. A third movement (3) is from the lower page "11" erased state 201 to an upper page "01" programmed state 211. In the embodiment of FIG. 2A, the "10" state means the upper page is in the unprogrammed logic state 1 and the lower page is in the programmed logic state 0. Each of the three Vt movements just described for the cell distribution 200 in FIG. 2A, can result from progressively elevated levels of threshold voltage causing progressively elevated stored voltages in the MLC storage ranges 205, 209, and 211.

The threshold voltage distribution shown in FIG. 2A is only one embodiment of cell state assignments. Alternate embodiments can assign cell states to different threshold voltage distributions. The embodiments of the combined SLC and MLC programming method of the present disclosure can be utilized with various possible cell state arrangements.

Figure 2B:
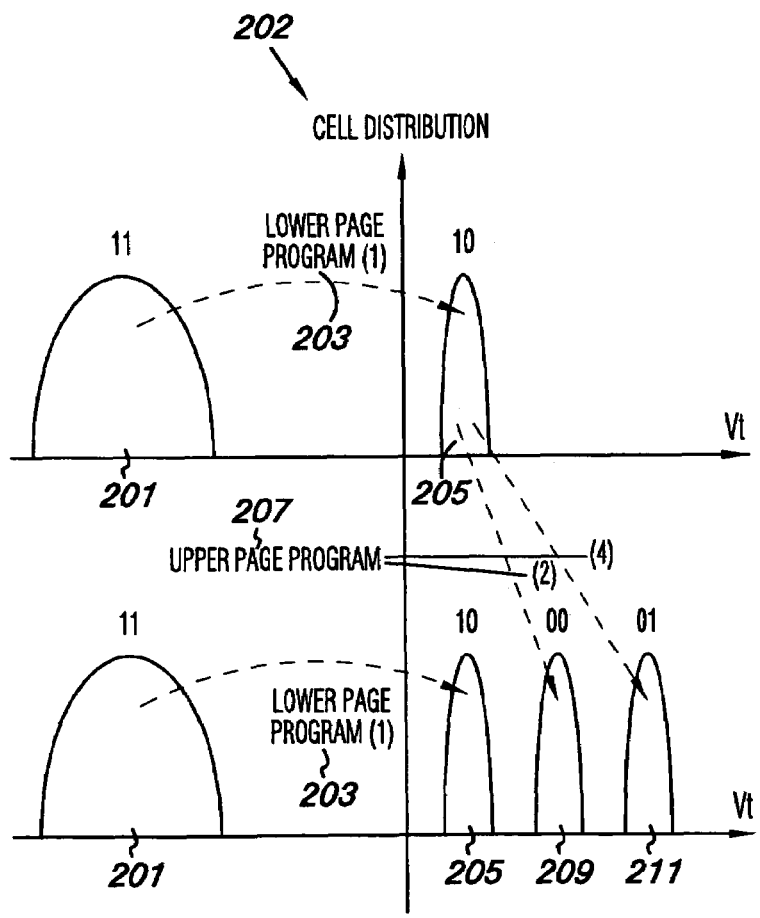

FIG. 2B is another threshold voltage distribution for a multiple level non-volatile memory cell and results of lower and upper page programming. FIG. 2B illustrates the Vt distribution 202 movements resulting from a selected MLC programming. The embodiment illustrated in FIG. 2B can experience three possible Vt movements from a logical "11" erased state 201. The first movement (1) can use a lower page program 203, similar to SLC programming, to raise the stored threshold voltage from the logical "11" erased state 201 to a logical "10 " programmed state 205.

In the MLC embodiment of FIG. 2B, an upper page program 207 has two possible Vt movements based on storage of elevated threshold voltage in distinct ranges. The second movement (2) is from the lower page "10" programmed state 205 to an upper page "00" programmed state 209, as shown in FIG. 2A. In the embodiment illustrated in FIG. 2B, a fourth movement (4) differs from the third movement (3) illustrated in FIG. 2A. The fourth movement (4) of the upper page program 207 is from the lower page "10" programmed state 205 to an upper page "01" programmed state 211 resulting from providing a threshold voltage to lower page "10" programmed state 205 with higher potential than that used to reach the upper page "00" programmed state 209. Each of the three Vt movements just described for the cell distribution 202 in FIG. 2B, can result from progressively elevated levels of threshold voltage causing progressively elevated stored voltages in the MLC storage ranges 205, 209, and 211.

The threshold voltage distribution shown in FIG. 2B is only one embodiment of cell state assignments. Alternate embodiments can assign cell states to different threshold voltage distributions. The embodiments of the combined SLC and MLC programming method of the present disclosure can be utilized with various possible cell state arrangements.

Figure 3:
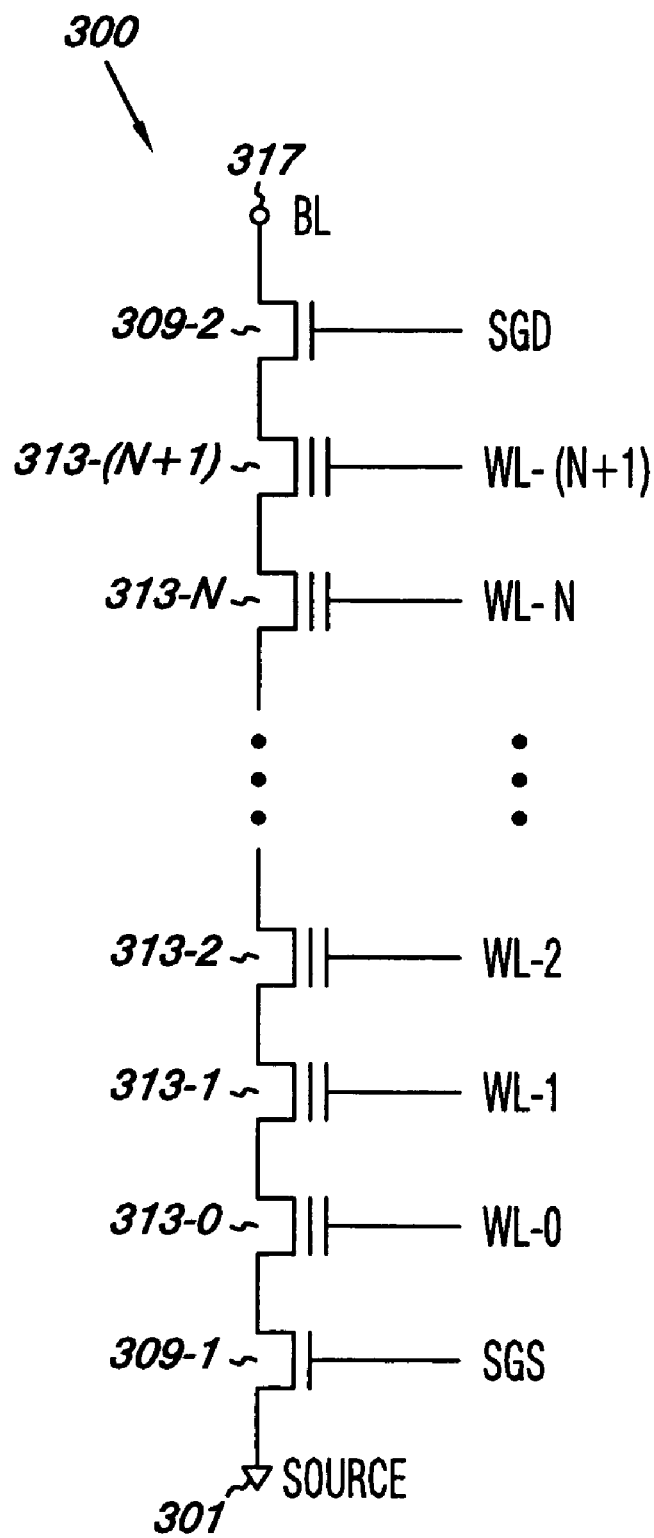
FIG. 3 illustrates a portion of a non-volatile memory array architecture in accordance with an embodiment of the present disclosure.

FIG. 3 is a top view of a portion of a non-volatile memory array architecture 300 in accordance with an embodiment of the present disclosure. The embodiment of FIG. 3 illustrates a string 300 of non-volatile memory cells in a NAND architecture memory array. Embodiments, however, are not limited to NAND architecture. As shown in FIG. 3, a first potential, e.g., source potential, 301 is coupled to one end of the string of non-volatile memory cells by a first select gate transistor, e.g., source select gate (SGS), 509-1. In the embodiment of FIG. 3 the string of non-volatile memory cells, e.g., 313-0, 313-1, 313-2, . . ., 313-N, 313-(N+1), are each associated with a respective word line, e.g., WL-0, WL-1, WL-2, . . . , WL-N, WL-(N+1). The designator "N" intends that the string can include a number of non-volatile memory cells and associated word lines according to various embodiments.

As shown in FIG. 3, a second select gate transistor, e.g., drain select gate (SGD), 309-2 couples a bit line (BL) 317 to the other end of the string of non-volatile memory cells, e.g., 313-0, 313-1, 313-2, . . . , 313-N, 313-(N+1). According to various embodiments, more that one select gate can be provided to each end of the string of non-volatile memory cells, e.g., 313-0, 313-1, 313-2, . . ., 313-N, 313-(N+1). Several examples of providing more than one select gate to each end of a string of non-volatile memory cells, e.g., 313-0, 313-1, 313-2, . . . 313-N, 313-(N+1) are described in copending, commonly assigned US patent applications: Ser. No. 11/216, 755, entitled "Multiple Select Gate Architecture", filed on Aug. 31, 2005; Ser. No. 11/218,848, entitled "Operation of Multiple Select Gate Architecture, filed on Sep. 1, 2005; Ser. No. 11/411,376, entitled "Multiple Select Gates With Non-Volatile Memory Cells", filed on Apr. 26, 2006, all three by the same inventor as the present disclosure, and which are incorporated herein by reference.

According to various embodiments, the string of non-volatile memory cells 300 includes a number of non-volatile memory cells, e.g., 313-0, 313-1, 313-2, . . . , 313-N, 313-(N+1), some of which are single level non-volatile memory cells (SLCs) and some of which are multiple level non-volatile memory cells (MLCs). Various examples of series string of non-volatile memory cells having SLCs and MLCs are described in copending, commonly assigned US patent application: Ser. No. 11/500,153, entitled "Non-Volatile Memory Device with Both Single and Multiple Level Cells", filed on Aug. 7, 2006, by inventor Jin-Man Han, which is incorporated herein by reference.

However, the embodiments described herein differ from the above referenced application in that a first select gate, e.g., SGS 309-1, is coupled to a first SLC, e.g., 313-0, which is interposed between and coupled to the first select gate, SGS 309-1, and a first MLC, e.g., 313-1. The first MLC 313-1 is directly coupled to a continuous number of additional multiple level non-volatile memory cells, e.g., 313-2, . . . , 313-N. The MLCs are comprised of a lower page and at least one upper page of data and the SLCs are comprised of a single page of data. As the reader will appreciate, a memory cell capable of storing two alternative data input selections on a single page can be termed a "1-bit memory cell" or, as described in the present disclosure, a SLC. A memory cell capable of storing two alternative data input selections on a lower page and two alternative data input selections on one or more upper pages can be termed a "2-bit memory cell" or, as described in the present disclosure, a MLC. Embodiments, however, are not limited to 2-bit MLCs.

According to various embodiments of the present disclosure the first SLC 313-0 has a programmed voltage that is intermediate between a higher programmed voltage for the upper page of the first MLC 313-1 and a lower resting voltage, e.g., 0.0 V or ground, of the first select gate SGS 309-1.

In FIG. 3, the portion of the memory array 300 includes a second select gate, e.g., SGD 309-2, coupled in series to an opposite end of the number of non-volatile memory cells relative to the first select gate SGS 309-1. According to various embodiments the string of non-volatile memory cells includes a second SLC 313-(N+1) interposed between and coupled to the second select gate SGD 309-2 and a second MLC, e.g., 313-N. In various embodiments, the second SLC 313-(N+1) has a programmed voltage that is intermediate between a higher programmed voltage for the upper page of the second MLC 313-N and a lower resting voltage, e.g., 0.0 V or ground, of the second select gate 309-2.

As mentioned in the background, MLCs take advantage of the analog nature of a traditional flash cell by assigning a bit pattern to a specific threshold voltage (Vt) range stored on the cell. This technology permits the storage of two or more bits per cell, depending on the quality of voltage ranges assigned to the cell and the stability of the assigned voltage ranges during the lifetime operation of the memory cell. For example, as illustrated in FIGS. 2A and 2B, a cell may be assigned four different voltage ranges of 200 millivolts (mV) for each range. A margin of 0.2V to 0.4V may be provided between each range to keep the Vt distributions from overlapping. If the threshold voltage stored on a cell is within the first range, the cell is storing a logical 11 state which can be considered the erased state of the cell. If the voltage is within the second range, the cell is storing a logical 01 state. This continues for as many ranges that are used for the cell provided these voltage ranges remain stable during the lifetime operation of the memory cell.

One issue with MLC devices is the floating gate to floating gate coupling that occurs along the same bit line. This coupling can cause the already small margins between states to be reduced, i.e., narrowed, or even disappear, and the Vt distributions to overlap, thus causing errors in reading data. As illustrated in connection with FIG. 1, the unprogrammed logic state, e.g., state 1, of a SLC can be lower than the stored threshold voltage of the programmed logic state, e.g., state 0. For example, the unprogrammed logic state, state 1, may have a threshold voltage of −0.5V while the programmed logic state, state 0, may have a stored threshold voltage in the range +0.8V to +1.0 V. As illustrated in connection with FIGS. 2A and 2B, the unprogrammed logic state, e.g., state 11, of a MLC can be lower than the stored threshold voltage of a programmed logic state, e.g., state 01. For example, the unprogrammed logic state, state 11, may have a threshold voltage of −0.5V while the programmed logic state, state 01, may have a stored threshold voltage in the range of +3.0V to +3.2V.

During a programming operation, a selected word line (WL) for a flash non-volatile memory cell to be programmed is biased with a series of programming pulses that might start at approximately 16.0V and increase incrementally to 20.0V for an SLC and even higher, e.g. to 22.0V, for a MLC. Thus, as the reader will appreciate, the programmed logic state of an upper page in a MLC, e.g., logic state 01, can have a stored potential relative to the unprogrammed state, e.g., logic state 11, that is substantially higher (approximately 3.0V) than that of the programmed threshold voltage of the SLC, e.g., logic 0, (approximately 0.8V) relative to its unprogrammed state, e.g., logic 1, (approximately 0.0V). The programmed threshold voltage of the SLC, e.g., logic 0, may be similar (+0.8V to 1.0V) to the lower page programming of an MLC. That is the logic state 10 in FIGS. 2A and 2B means the upper page of the MLC is logic 1, "erased", and the lower page of the MLC is logic 0, "programmed".

In some programming scenarios, a potential of a select gate can be as low as, or lower than, the potential of an adjacent SLC or an adjacent MLC. The higher the potential differential of a programmed memory cell relative to its adjacent select gate, the higher the probability that the select gate and the memory cell will undergo coupling such that current leakage from the memory cell reduces the stored potential enough to fall into a range of a different logical state so as to result in errors in reading the stored data.

Since the highest programming voltages placed on a selected WL to program a MLC occur only during programming the upper page of the MLC, the present embodiments implement an non-volatile memory cell architecture whereby only SLC are used adjacent to select gates. In other words, the edge word lines on either end of the string of non-volatile memory cells, e.g., WL-0 and WL-(N+1) in FIG. 3, will only have lower page programming applied thereto. As such, the voltage difference between the edge word line and the adjacent select gate, e.g., WL-0 and SGS, can be reduced from upper page Vt peak 211 in FIGS. 2A and 2B (e.g., 3.0V) to lower page Vt peak 205 in FIGS. 2A and 2B (e.g., 0.8V). In various embodiments, this voltage difference reduction may reduce the voltage difference between the edge word line and the adjacent select gate, e.g., WL-0 and SGS, by approximately 2.0V (e.g., 3.0V-0.8V). According to the embodiments, this voltage difference reduction may significantly reduce charge leakage and select gate to word line breakdown, thus reducing the occurrence of errors in reading data.

The embodiments described herein, in effect, use a first SLC 313-0 interposed between and coupled to the first select gate, SGS 309-1, and a first MLC 313-1 and can use a second SLC 313-(N+1) interposed between and coupled to the second select gate SGD 309-2 and a second MLC 313-N to shield a high potential 2-bit MLC from current leakage to an adjacent low potential select gate. In other words, a 1-bit SLC with an intermediate potential can be interposed between the MLC and the select gate. For example, having a 1-bit SLC that is programmed to a 0 logic state, and storing 1.0 V potential, interposed between a 2-bit MLC that is programmed to a 01 logic state, and storing 3.0 V potential, and a select gate with ground potential (e.g., 0 V) can prevent current leakage to the select gate. Further, in various embodiments, when the first MLC 313-1 and/or the second MLC 313-N is programmed the first SLC 313-0 and/or second SLC 313 is also programmed such that the potential difference between the MLC and the SLC is reduced to approximately 2.0 V or less, which can reduce the probability of current leakage relative to a 3.0 V potential difference between the MLC and the select gate.

Moreover, as described in connection with the embodiment of FIG. 3, the first non-volatile memory cell 313-1 is directly coupled to a continuous number of additional multiple level non-volatile memory cells, e.g., 313-2, . . . , 313-N. The MLCs are comprised of a lower page and at least one upper page of data and the SLCs are comprised of a single page of data. As such, the memory string architecture can provide a substantially increased bit density relative to a string of alternating MLC/SLCs (e.g., as described in copending, commonly assigned U.S. patent application Ser. No. 11/500,153, entitled "Non-Volatile Memory Device with Both Single and Multiple Level Cells", filed on Aug. 7, 2006, by inventor Jin-Man Han, which is incorporated herein by reference) and relative to a string of strictly SLCs while also maintaining and/or improving memory stability (e.g., reducing read errors) by reducing a source of charge leakage.

In various embodiments, as will be discussed in more detail in connection with FIG. 4, non-volatile memory block uniformity can be maintained by adding one or more additional word lines (WLs) to account for the SLCs separating the MLCs from the select gates. For example, the embodiment of FIG. 3 illustrates one SLC separating a string of two (2)-bit MLCs from a source select gate (SGS) and another SLC separating the string of MLCs from a drain select gate (SGD).

In this example embodiment, if the previous non-volatile memory block were to include "N" MLCs, associated with "N" word lines (WLs) in each block, then the embodiment of FIG. 3 illustrates the inclusion of one additional word line, e.g., WL-(N+1) is provided to maintain uniformity to previous memory block size. That is, if the previous memory block size was 64 bits then thirty-two (32) MLCs could have been provided in each string and associated with 32 WLs (e.g., N=32). Each of the 32 MLCs would have provided for four (4) logical programmed states—that is, two (2) bits or pages of information—for a total of 128 logical programmed states (e.g., 32×4=128). In the embodiment of FIG. 3, word lines WL-0 and WL-(N+1) are associated only with SLCs capable of providing one (1) page of information, and word lines WL-1, . . . , WL-N, are associated with MLCs each providing two (2) pages of information.

If N were previously thirty-two (32) to achieve 64 pages per block, then in this embodiment thirty-three (33) word lines are provided, e.g., WL-0 through WL-(N+1). WL-0 is coupled to the SLC 313-0 separating the SGS 309-1 from the string of MLCs on one end of the string. WL-(N+1) is coupled to the SLC 313-(N+1) separating the SGD 309-2 from the string of MLCs on the other end of the string. That is, in this example embodiment thirty one (31) MLCs, associated with WL-1 through WL-N, are connected in series between the two SLCs associated with WL-0 and WL-(N+1). This example embodiment illustrates an implementation for adding one additional word line, e.g., WL-(N+1), to achieve a string of thirty-one (31) MLCs (313-1, . . . , 313-31) providing 124 logical programmed states (31×4=124) and another two (2) SLCs (313-0 and 313-(N+1)) in the string provide another 4 logical programmed states (2×2=4) to maintain the total of 128 logical programmed states—that is, 64 pages of information—in the block. Embodiments, however, are not limited to this example.

Figure 4:
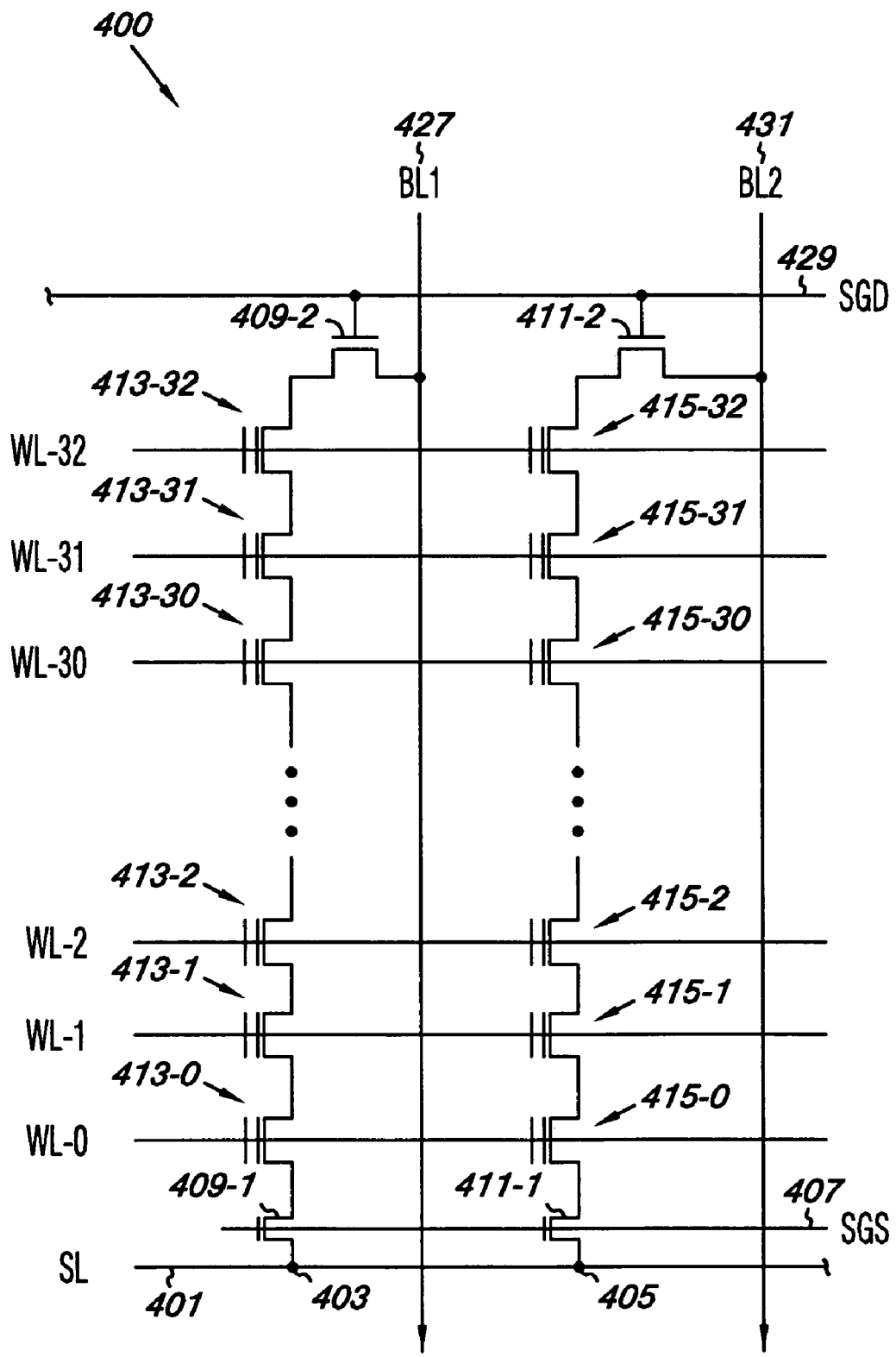
FIG. 4 illustrates a portion of a non-volatile memory array architecture illustrating a number of strings of non-volatile memory cells in accordance with an embodiment of the present disclosure.

FIG. 4 illustrates a portion of a non-volatile memory array 400 architecture illustrating a number of strings of non-volatile memory cells in accordance with an embodiment of the present disclosure. For ease of illustration, the portion of non-volatile memory array 400 does not show all of the elements associated with a memory array. For example, only two bit lines are shown, e.g., BL1 at 427 and BL2 at 431. The number of bit lines implemented in an actual memory array can depend upon intended memory capacity and/or density.

The non-volatile memory array 400 embodiment of FIG. 4 illustrates an array of floating gate non-volatile memory cells arranged from a source line (SL) at 401 in two series strings 403, 405. The embodiment of FIG. 4 shows a NAND architecture for the non-volatile memory cells. That is, each of the floating gate memory cells is series coupled source to drain in each NAND string 403, 405. Embodiments, however, are not limited to this example. Word lines WL-0 through WL-32 span across both series strings 403, 405 to couple the control gates of each memory cell in a row, e.g., 413-0 and 415-0 on WL-0, to control operation of the memory cells. The embodiment of FIG. 4 shows 33 word lines per memory block, although alternative embodiments could have different numbers of word lines.

In operation, the word lines WL-0 through WL-32 select the individual floating gate memory cells in the series string 403, 405 to be written to or read from and operate the remaining floating gate memory cells in each series string 403, 405 in a pass through mode. Examples of reading, writing, and programming non-volatile memory cells are provided in the above referenced, copending, commonly assigned references which are incorporated herein by reference. Each series string 403, 405 is coupled to the source line 401 by a source select gate SGS, e.g., 409-1 and 411-1, and to an individual bit line, e.g., BL1 at 427 and BL2 at 431, by a drain select gate SGD, e.g., 409-2 and 411-2. The SGSs 409-1 and 411-1 are controlled by coupling to a source select gate control line 407. The SGDs 409-2 and 411-2 are controlled by coupling to a drain select gate control line 429.

According to various embodiments, at least one string, e.g., 403 and/or 405, includes a non-volatile memory cell string according to the embodiments described in connection with FIG. 3. Hence, using string 403 as an example, non-volatile memory cells 413-0 and 413-32 are operated as a SLCs while non-volatile memory cells 413-1, ..., 413-31 are operated as MLCs. String 405 can have an analogous structure. For example, in the embodiment shown in FIG. 4, WL-0 adjacent SGSs 409-1 and 411-1 is coupled to SLCs 413-0 and 415-0 interposed between the SGSs 409-1 and 411-1 and MLCs 413-1 and 415-1 associated with WL-1. MLCs 413-1 and 415-1 on WL-1 are then adjacent to MLCs 413-2 and 415-2 on WL-2. As shown in the embodiment, the strings, 403 and 405 continue, repeating MLCs up until MLCs 413-31 and 415-31 associated with WL-31. The strings, 403 and 405, then end with SLCs 413-32 and 415-32 interposed between MLCs 413-31 and 415-31 and the SGDs 409-2 and 411-2 respectively. Embodiments, however, are not limited to this example number of non-volatile memory cells and can contain an alternative number and/or arrangement of non-volatile memory cells and word lines. The advantages attained and presented in the discussion of embodiments in FIG. 3 can similarly be realized in the memory array of FIG. 4.

The embodiment of FIG. 4 is further useful for illustrating another example embodiment of the present disclosure. That is, the embodiment of FIG. 4 is useful for illustrating that non-volatile memory block uniformity can be maintained by adding one or more additional word lines (WLs) to account for the SLCs separating the MLCs from the select gates. For example, the embodiments of FIGS. 3 and 4 illustrate one SLC separating a string of two (2)-bit MLCs from a source select gate (SGS) and another SLC separating the string of MLCs from a drain select gate (SGD). In the example embodiment of FIG. 3, if a previous non-volatile memory block were to include "N" MLCs, associated with "N" total word lines (WLs) in each block, then the embodiment of FIG. 3 illustrates the inclusion of one additional word line, e.g., WL-(N+1) is provided to maintain uniformity to previous memory block size. For example, if the previous memory block size was 64 pages, then thirty-two (32) MLCs could have been provided in each string and associated with 32 WLs (e.g., N=32). Each of the 32 MLCs would have provided two (2) pages of information for a total of 64 pages of information (e.g., 32×2=64). In contrast, in the embodiment of FIG. 3, word lines WL-0 and WL-(N+1) are associated only with SLCs capable of providing one (1) page of information, and word lines WL-1, ..., WL-N, are associated with MLCs providing two (2) pages of information.

Thus, if N were previously thirty-two (32) to achieve 64 pages per block, then in the embodiment of FIG. 3 thirty-three (33) word lines are provided, e.g., WL-0 through WL-(N+1). In FIG. 3, WL-0 is coupled to the SLC 313-0 separating the SGS 309-1 from the string of MLCs on one end of the string and WL-(N+1) is coupled to the SLC 313-(N+1) separating the SGD 309-2 from the string of MLCs on the other end of the string.

FIG. 4 similarly illustrates such an embodiment. That is, in the embodiment of FIG. 4 thirty one (31) MLCs (413-1, ..., 413-31), associated with WL-1 through WL-31, are connected in series between the two SLCs (413-0 and 413-32) associated with WL-0 and WL-32. Hence, the example embodiment of FIG. 4 illustrates an implementation for adding one additional word line, e.g., WL-32, to achieve a string of thirty-one (31) MLCs (413-1, ..., 413-31) providing 124 logical programmed states (31×4=124) and another two (2) SLCs (413-0 and 413-32) in the string provide another 4 logical programmed states (2×2=4) to maintain the total of 128 logical programmed states, or 64 pages, in the block. Embodiments, however, are not limited to this example. In some embodiments, all the non-volatile memory cells on a string can be comprised of MLCs. For example, WL-0 and WL-32 can have two (2) bits per memory cell and WL-1 through WL-31 can have four (4) bits per cell, which can result in a string including 128 bits, or pages.

Figure 5:
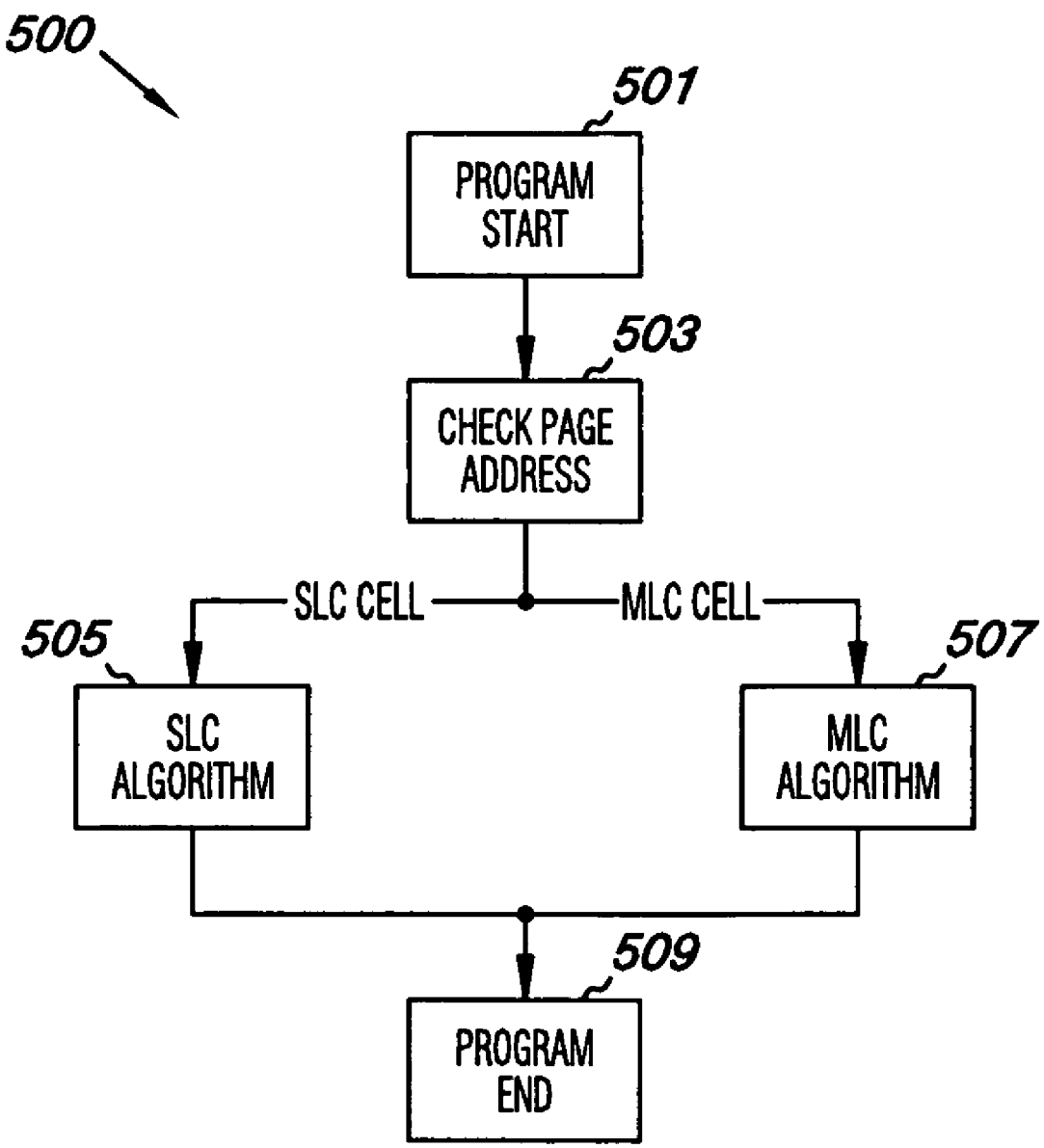
FIG. 5 is a flowchart for programming single level and multiple level non-volatile memory cells in accordance with an embodiment of the present disclosure.

FIG. 5 is a flowchart for programming single level and multiple level non-volatile memory cells in accordance with an embodiment of the present disclosure. The programming process 500 can have a program start 501 that checks a user supplied page address 503 to determine whether programming of one or more of the SLCs and/or one or more of the MLCs in the memory array is required. For example, referring to FIG. 3, if programming of either SLC 313-0 or 313-(N+1) is selected, a SLC algorithm 505 illustrated in FIG. 5 is employed. Referring to again to FIG. 3, if programming of MLCs 313-1, ..., 313-N is selected, a MLC algorithm 507 illustrated in FIG. 5 is employed. When programming of each of the required memory cells is accomplished, the program can end 509.

Programming as illustrated in FIG. 5 can be performed using a memory array that, in various embodiments, includes a number of NAND strings of non-volatile memory cells, a number of source select gates on a source side of a string, and a number of drain select gates on a drain side of a string. The number of source select gates includes a number of source select gates individually coupled to a SLC, and the number of drain select gates includes a number of drain select gates individually coupled to another SLC. Additionally, in various embodiments the SLC individually coupled to the source select gates and the SLC individually coupled to the drain select gates are coupled to and separated by a continuous series of multiple level non-volatile memory cells.

A variety of programming modes affecting the architecture of strings of non-volatile memory cells can be used to mitigate the occurrence and/or the effects of current leakage. Related examples are described in the above referenced copending, commonly-assigned U.S. patent applications.

FIG. 6A illustrates an operational table for a programming sequence that can be implemented with the non-volatile memory array architecture in accordance with an embodiment of the present disclosure. The operational table 600 in FIG. 6A illustrates a sequence of programming whereby one page (0) is programmed on a first SLC coupled to WL-0 in an even string 602 of 33 non-volatile memory cells followed by programming one page (1) on a second SLC coupled to WL-0 in an odd string 604 of 33 non-volatile memory cells.

After programming the one page on each of the two SLCs associated with WL-0, programming of the two MLCs associated with each of word lines WL-1 through WL-31 can begin. In the embodiment of operational table 600, the lower page (2) of the first MLC associated with WL-1 on the even string 602 is programmed following programming of the two SLCs associated with WL-0. Next, the upper page (3) of the same MLC associated with WL-1 on the even string 602 is programmed before programming of the second MLC associated with WL-1, which is on the odd string 604 of 33 non-volatile memory cells. The lower page (4) of the second MLC associated with WL-1 is programmed in this embodiment before the upper page (5) of the second MLC is programmed.

After the pair of MLCs associated with WL-1 is programmed, programming of the pair of MLCs associated with WL-2 can be performed in a similar manner. That is, the lower page (6) of the MLC on the even string 602 is programmed before the upper page (7) is programmed, which is followed by programming the lower page (8) on the odd string 604 before programming the upper page (9). A sequential progression through each of the MLCs associated with WL-3 through WL-31 on the even string 602 and the odd string 604 can be similarly programmed.

In the embodiment shown in operational table 600, after all the pages in the MLCs have been programmed, the page (126) of the third SLC, which is associated with WL-32 on the even string 602, can be programmed. After the one page (126) of the third SLC is programmed, the last page (127) can be programmed on the fourth SLC, which is associated with WL-32 on the odd string 604. By enabling sequential programming of pages 0-127 as shown in the operational table 600, the non-volatile memory array architecture with even and odd pages each having 33 non-volatile memory cells can provide 128 pages of storable memory.

FIG. 6B illustrates an operational table for another programming sequence that can be implemented with the non-volatile memory array architecture in accordance with an embodiment of the present disclosure. The operational table 601 in FIG. 6B illustrates a sequence of programming whereby one page (0) is programmed on a first SLC coupled to WL-0 in an even string 603 of 33 non-volatile memory cells followed by programming one page (1) on a second SLC coupled to WL-0 in an odd string 605 of 33 non-volatile memory cells.

After programming the one page on each of the two SLCs associated with WL-0, programming of the non-volatile memory cells associated with each of word lines WL-1 through WL-32 can begin. In the embodiment of operational table 601, the lower page (2) of the first MLC associated with WL-1 on the even string 603 is programmed following programming of the two SLCs associated with WL-0. Next, the lower page (3) of the second MLC associated with WL-1, which is located on the odd string 605, is programmed, followed by programming of the lower page (4) of a third MLC, which is associated with WL-2 on the even string 603 of 33 non-volatile memory cells. The lower page (5) of a fourth MLC associated with WL-2 on the odd string 605 is programmed in this embodiment before the upper page (6) is programmed on the first MLC associated with WL-1 on the even string 603. After the upper page (6) on the first MLC associated with WL-1 on the even string 603 is programmed, the upper page (7) of the second MLC associated with WL-1 on the odd string 605 can be programmed.

The programming sequence embodiment just described with regard to operational table 601, is formulated such that the stored potential (e.g., 0.8 V) of the two SLC pages (0, 1) of WL-0 is elevated relative to an unprogrammed state (e.g., 0.0 V) before the lower pages (2, 3) and, in particular, the upper pages (6, 7) of the two MLCs associated with WL-1 are programmed so as to have elevated stored potentials (e.g., 3.0 V). Moreover, the programming sequence embodiment illustrated in operational table 601 allows the lower pages (4, 5) of the two MLCs associated with WL-2 to be programmed so as to have elevated stored potentials (e.g., 0.8-1.0 V instead of 0.0 V) before the upper pages (6, 7) of the two MLCs associated with WL-1 are programmed so as to have elevated stored potentials (e.g., 3.0 V).

Hence, the programming sequence embodiment shown in operational table 601 can reduce the probability of coupling of one or more programmed MLCs in a word line adjacent a select gate (e.g., the SGS) and also can reduce the probability of coupling with an unprogrammed MLC on a word line located more distal on the string. As such, the probability of current drainage resulting in erroneous reading of stored data can be reduced.

After the upper pages (6, 7) of the pair of MLCs associated with WL-1 are programmed, programming of the pair of lower pages (8, 9) of the MLCs associated with WL-3 can be performed. That is, the upper page (6) of the MLC associated with WL-1 on the even string 603 is programmed before the upper page (7) is programmed on the MLC associated with WL-1 of the odd string 605, which is followed by programming the lower page (8) of the MLC associated with WL-3 on the even string 603 before programming the lower page (9) of the MLC associated with WL-3 on the odd string 605.

A sequential progression through each of the MLCs associated with WL-3 through WL-30 on the even string 602 and the odd string 604 can be programmed in accordance with the sequence just described, as illustrated in the embodiment of operational table 601. For example, before the upper page of one or more MLCs associated with a word line on one or more strings is programmed, the lower page of each MLC associated with adjacent word lines (e.g., WL-5 and WL-7 are adjacent WL-6) on the one or more strings is programmed. Programming of lower pages of multiple MLCs proximal to a MLC with a programmed upper page having an elevated stored potential can reduce the probability of coupling with, and current leakage to, MLCs located on the same string and also cross-coupling with, and current leakage to, MLCs located on different strings.

In the embodiment shown in operational table 601, after the upper pages (122, 123) have been programmed on the MLCs associated with WL-30, the page (124) of a third SLC, which is associated with WL-32 on the even string 603, is programmed. After the one page (124) of the third SLC is programmed, the one page (125) can be programmed on a fourth SLC, which is associated with WL-32 on the odd string 605. When the stored potentials of both SLCs associated with WL-32, and adjacent the select gate (e.g., the SGD), have been elevated (e.g., from 0.0 to 0.8 V), the upper pages (126, 127) of the MLCs associated with WL-31 on the even string 603 and the odd string 605 can be programmed to elevate the stored potential (e.g., to 3.0 V). Consistent with the programming sequence described above for the embodiment of operational table 601, the lower pages (120, 121) of the MLCs associated with WL-31 are programmed before the upper pages (122, 123) of the MLCs associated with of WL-30.

Hence, the probability can be reduced for coupling a proximal MLC with, and current leakage to, a second select gate (e.g., the SGD) at one end of a string relative to a first select gate (e.g., the SGS) at the other end of the string. In addition, the probability can be reduced for coupling of a last MLC on a string that has a programmed upper page with elevated stored potential with a proximal unprogrammed MLC in the direction of the first select gate because the proximal MLCs have already elevated lower page potentials. By programming the lower pages of MLCs associated with word lines in the direction of the first select gate and located on other strings, the probability can be reduced for cross-coupling of a last MLC on a string having an elevated upper page potential with proximal MLCs on other strings. As described above for the embodiment illustrated in operational table 600, by enabling sequential programming of pages 0-127 as shown in operational table 601, the non-volatile memory array architecture with even and odd pages each having 33 non-volatile memory cells can provide 128 pages of storable memory.

In an embodiment of the present disclosure, formation of new memory blocks that maintain a previous memory block size can be accomplished by adding a number of word lines to a string having a number of single level non-volatile memory cells and a number of multiple level memory cells for maintaining a previous memory block size. In various embodiments, adding the number of word lines can include adding a number of non-volatile memory cells selected from single level non-volatile memory cells and multiple level memory cells. In some embodiments, forming the memory block can include using one or more strings having a number of single level non-volatile memory cells and a number of multiple level memory cells.

In some embodiments, maintaining the previous memory block size can include maintaining a particular number selected from data input selection choices, memory bits, and/or pages associated with the previous memory block size. Additionally, maintaining the previous memory block size in some embodiments can include maintaining the number of data input selection choices on a string at around, or exactly, 128, the number of memory bits on a string at around, or exactly, 64, and/or the number of pages in a memory block at around, or exactly, 128.

Figure 7:
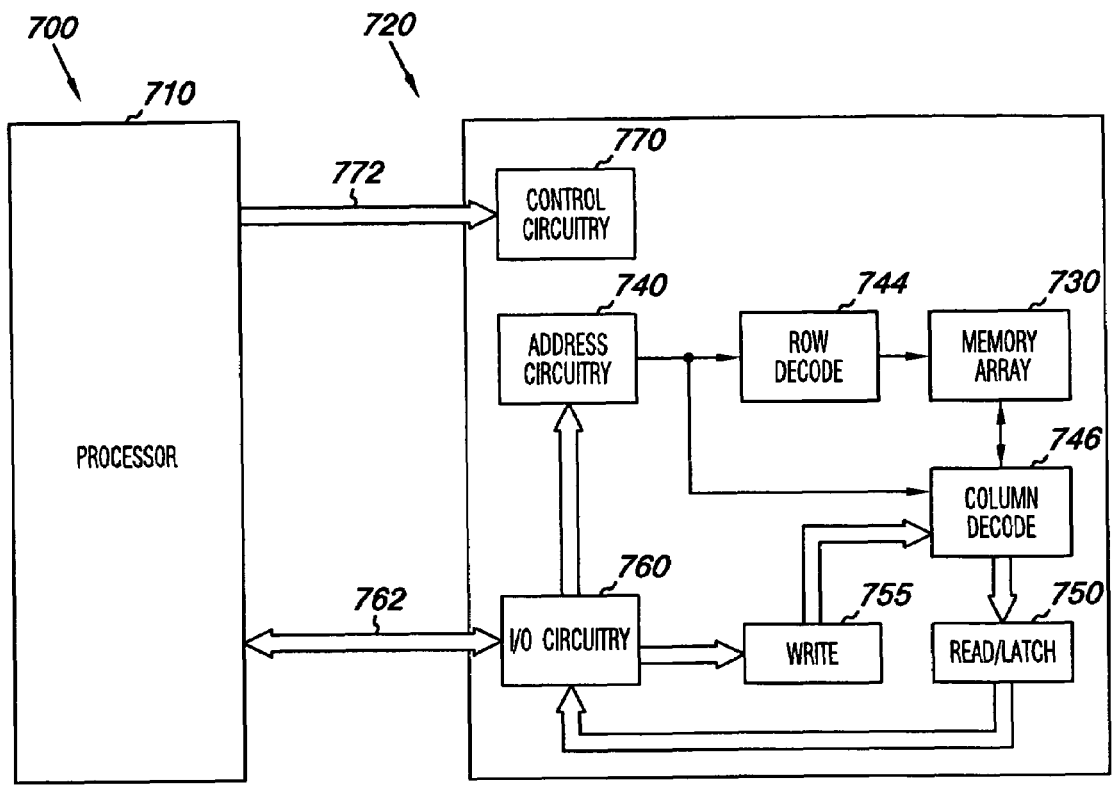
FIG. 7 is a functional block diagram of an electronic memory system having at least one memory device in accordance with an embodiment of the present disclosure.

FIG. 7 is a functional block diagram of an electronic memory system having at least one memory device in accordance with an embodiment of the present disclosure. Memory system 700 includes a processor 710 coupled to a non-volatile memory device 720 that includes a memory array 730 of non-volatile cells. The memory system 700 can include separate integrated circuits or both the processor 710 and the memory device 720 can be on the same integrated circuit. The processor 710 can be a microprocessor or some other type of controlling circuitry such as an application-specific integrated circuit (ASIC).

For clarity, the electronic memory system 700 has been simplified to focus on features with particular relevance to the present disclosure. The memory device 720 includes an array of non-volatile memory cells 730, which can be floating gate flash memory cells with a NAND architecture. The control gates of each row of memory cells are coupled with a word line, while the drain regions of the memory cells are coupled to bit lines. The source regions of the memory cells are coupled to source lines. As will be appreciated by those of ordinary skill in the art, the manner of connection of the memory cells to the bit lines and source lines depends on whether the array is a NAND architecture, a NOR architecture, and AND architecture, or some other memory array architecture.

The embodiment of FIG. 7 includes address circuitry 740 to latch address signals provided over I/O connections 762 through I/O circuitry 760. Address signals are received and decoded by a row decoder 744 and a column decoder 746 to access the memory array 730. In light of the present disclosure, it will be appreciated by those skilled in the art that the number of address input connections depends on the density and architecture of the memory array 730 and that the number of addresses increases with both increased numbers of memory cells and increased numbers of memory blocks and arrays.

The memory array 730 of non-volatile cells can have a NAND architecture as an embodiment of the present disclosure. The non-volatile memory cells (not shown in FIG. 7) of the memory array 730 can be floating gate memory cells, NROM cells, or other types of one-transistor non-volatile memory cells.

The memory device 720 reads data in the memory array 730 by sensing voltage and/or current changes in the memory array columns using sense/buffer circuitry that in this embodiment can be read/latch circuitry 750. The read/latch circuitry 750 can be coupled to read and latch a row of data from the memory array 730. I/O circuitry 760 is included for bi-directional data communication over the I/O connections 762 with the processor 710. Write circuitry 755 is included to write data to the memory array 730.

Control circuitry 770 decodes signals provided by control connections 772 from the processor 710. These signals can include chip signals, write enable signals, and address latch signals that are used to control the operations on the memory array 730, including data read, data write, and data erase operations. In various embodiments, the control circuitry 770 is responsible for executing instructions from the processor 710 to perform the operating and programming methods of the present disclosure, as well as determining whether a particular memory cell is to be programmed using a SLC or a MLC algorithm. The control circuitry can be a state machine, a sequencer, or some other type of controller. It will be appreciated by those skilled in the art that additional circuitry and control signals can be provided, and that the memory device detail of FIG. 7 has been reduced to facilitate ease of illustration.

In various embodiments, the processor 710 and/or the control circuitry 770 control operation of the memory system 700 by applying a first select line potential to a source select gate and second select line potential to a drain select gate. The processor 710 and/or the control circuitry 770 apply a first word line potential to a second non-volatile memory cell in a NAND string relative to a direction of the source gate or the drain gate that is closer, where the second non-volatile memory cell is a first multiple level non-volatile memory cell directly coupled to at least one additional multiple level non-volatile memory cell. The processor 710 and/or the control circuitry 770 also apply a second word line potential to a first non-volatile memory cell in the NAND string, which is a single level non-volatile memory cell, where the second word line potential is lower than the first word line potential and greater than a potential of a directly coupled select gate. In some embodiments, a third word line potential is applied to a number of unselected non-volatile memory cells in the NAND string.

By having the potential of the SLC lower than the potential of the MLC, a probability of current leakage to either an adjacent SGS or an adjacent SGD from a programmed SLC can be reduced relative to a probability of current leakage from a programmed MLC with a higher potential. In various embodiments, programming by the processor 710 and/or the control circuitry 770 can contribute to reduction of current leakage when the memory array 730 has no SGS and no SGD adjacent a MLC in a NAND string, when each SGS and each SGD is adjacent a SLC in the NAND string, and where no MLC is adjacent more than one SLC in the NAND string. In some embodiments, programming can be performed using a memory array having a plurality of serial NAND strings each coupled to a bit line and a plurality of rows of non-volatile memory cells.

In various embodiments, programming a NAND flash memory device includes controlling memory operations using a memory control circuit. In some embodiments, controlling memory operations includes using a state machine as the memory control circuit.

As described in particular embodiments above, programming a memory array can be performed by programming a single level memory cell adjacent a select gate to a programmed state before a next adjacent multiple level memory cell is in a programmed state. In another embodiment of the present disclosure, programming a memory array can be performed by programming a single level memory cell adjacent a select gate to a programmed state when a next adjacent multiple level memory cell is already in a programmed state in order to reduce the probability of current leakage from the programmed multiple level memory cell to the select gate adjacent the single level memory cell.

Figure 8:
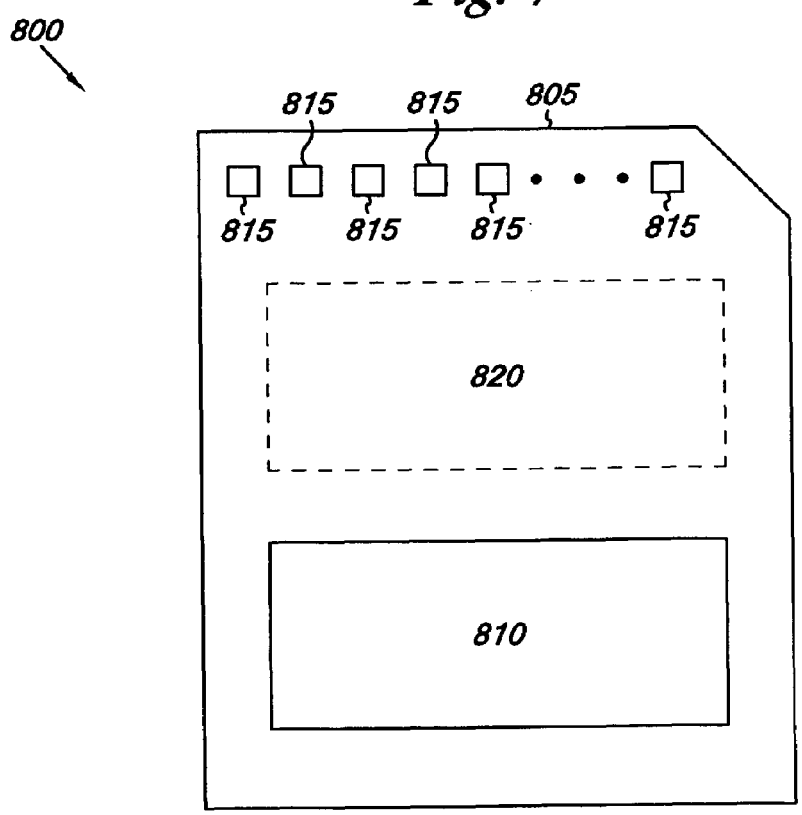
FIG. 8 is a functional block diagram of a memory module having at least one memory device in accordance with an embodiment of the present disclosure.

FIG. 8 is a functional block diagram of a memory module having at least one memory device in accordance with an embodiment of the present disclosure. Memory module 800 is illustrated as a memory card, although the concepts discussed with reference to memory module 800 are applicable to other types of removable or portable memory (e.g., USB flash drives) and are intended to be within the scope of "memory module" as used herein. In addition, although one example form factor is depicted in FIG. 8, these concepts are applicable to other form factors as well.

In some embodiments, memory module 800 will include a housing 805 (as depicted) to enclose one or more memory devices 810, though such a housing is not essential to all devices or device applications. At least one memory device 810 is a non-volatile memory having an architecture in accordance with an embodiment of the invention. Where present, the housing 805 includes one or more contacts 815 for communication with a host device. Examples of host devices include digital cameras, digital recording and playback devices, PDAs, personal computers, memory card readers, interface hubs and the like. For some embodiments, the contacts 815 are in the form of a standardized interface. For example, with a USB flash drive, the contacts 815 might be in the form of a USB Type-A male connector. For some embodiments, the contacts 815 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 815 provide an interface for passing control, address and/or data signals between the memory module 800 and a host having compatible receptors for the contacts 815.

The memory module 800 may optionally include additional circuitry 820, which may be one or more integrated circuits and/or discrete components. For some embodiments, the additional circuitry 820 may include a memory controller for controlling access across multiple memory devices 810 and/or for providing a translation layer between an external host and a memory device 810. For example, there may not be a one-to-one correspondence between the number of contacts 815 and a number of 810 connections to the one or more memory devices 810. Thus, a memory controller could selectively couple an I/O connection (not shown in FIG. 8) of a memory device 810 to receive the appropriate signal at the appropriate I/O connection at the appropriate time or to provide the appropriate signal at the appropriate contact 815 at the appropriate time. Similarly, the communication protocol between a host and the memory module 800 may be different than what is required for access of a memory device 810. A memory controller could then translate the command sequences received from a host into the appropriate command sequences to achieve the desired access to the memory device 810. Such translation may further include changes in signal voltage levels in addition to command sequences.

The additional circuitry 820 may further include functionality unrelated to control of a memory device 810 such as logic functions as might be performed by an ASIC. Also, the additional circuitry 820 may include circuitry to restrict read or write access to the memory module 800, such as password protection, biometrics or the like. The additional circuitry 820 may include circuitry to indicate a status of the memory module 800. For example, the additional circuitry 820 may include functionality to determine whether power is being supplied to the memory module 800 and whether the memory module 800 is currently being accessed, and to display an indication of its status, such as a solid light while powered and a flashing light while being accessed. The additional circuitry 820 may further include passive devices, such as decoupling capacitors to help regulate power requirements within the memory module 800.

CONCLUSION

Non-volatile memory devices have been described utilizing an architecture including an SLC interposed between a select gate and a MLC on the source and/or drain ends of non-volatile memory cell strings. By utilizing such a architecture, memory density can be increased while simultaneously reducing the probability of current leakage. By increasing the density of memory storage, the footprint of the non-volatile memory cell strings can be reduced, thereby facilitating smaller memory device sizing.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory array, comprising:
   a number of single level non-volatile memory cells;
   a number of multiple level non-volatile memory cells;
   a number of select gates coupled in series to the number of single level non-volatile memory cells and the number of multiple level non-volatile memory cells;
   wherein a first select gate is coupled to a first single level non-volatile memory cell interposed between and coupled to the first select gate and a first multiple level non-volatile memory cell that is directly coupled to a continuous number of additional multiple level non-volatile memory cells; and wherein the first single level non-volatile memory cell has a programmed voltage that is intermediate between a higher programmed voltage for an upper page of the first multiple level non-volatile memory cell and a lower resting voltage of the first select gate.

2. The array of claim 1, wherein the multiple level non-volatile memory cells are comprised of a lower page and at least one upper page of data and the single level non-volatile memory cells are comprised of a single page of data.

3. The array of claim 1, wherein the array includes a second select gate coupled in series to an opposite end of a number of multiple level non-volatile memory cells relative to the first select gate.

4. The array of claim 3, wherein the array includes a second single level non-volatile memory cell interposed between and coupled to the second select gate and a second multiple level non-volatile memory cell.

5. The array of claim 4, wherein the second single level non-volatile memory cell has a programmed voltage that is intermediate between a higher programmed voltage for the upper page of the second multiple level non-volatile memory cell and a lower resting voltage of the second select gate.

6. The array of claim 1, wherein the array includes a number of single level memory cells and a number of multiple level non-volatile memory cells coupled in series.

7. The array of claim 6, wherein the array includes a NAND string.

8. A memory array, comprising:
a number of NAND strings of non-volatile memory cells;
a number of source select gates on a source side of a string;
a number of drain select gates on a drain side of a string; and
wherein the number of source select gates includes a number of source select gates individually coupled to a single level non-volatile memory cell, and the number of drain select gates includes a number of drain select gates individually coupled to a single level non-volatile memory cell ; and
wherein the single level non-volatile memory cells individually coupled to the source select gates and the single level non-volatile memory cells individually coupled to the drain select gates are coupled to and separated by a continuous series of multiple level non-volatile memory cells ; and
wherein the single level non-volatile memory cells have a programmed voltage that is intermediate between a higher programmed voltage for an upper page of the multiple level non-volatile memory cells and a lower resting voltage of the source select gates and the drain select gates.

9. The array of claim 8, wherein the array is comprised of a NAND architecture of flash memory cells.

10. The array of claim 8, wherein the single level non-volatile memory cells are comprised of a single page of data and the multiple level non-volatile memory cells are comprised of a lower page and an upper page of data and wherein each page enables two data input selections.

11. The array of claim 10, wherein the NAND string enables 128 data input selections.

12. The array of claim 11, wherein the 128 data input selections are enabled by a continuous series of 31 multiple level non-volatile memory cells coupled to a first single level non-volatile memory cell that is coupled to a source select gate, and a second single level non-volatile memory cell that is coupled to a drain select gate.

13. A memory device, comprising:
an array of non-volatile memory cells including a string of non-volatile memory cells;
circuitry for control and access to the array of non-volatile memory cells;
wherein the array of non-volatile memory cells includes:
a number of single level non-volatile memory cells, wherein each single level non-volatile memory cell is only capable of being programmed to two logical states and providing one page of information;
a number of multiple level non-volatile memory cells, wherein each multiple level non-volatile memory cell is capable of providing a plurality of pages of information;
a number of select gates coupled in series to the number of single level non-volatile memory cells and the number of multiple level non-volatile memory cells;
wherein a first select gate is coupled to a first single level non-volatile memory cell interposed between and coupled to the first select gate and a first multiple level non-volatile memory cell that is directly coupled to a continuous number of additional multiple level non-volatile memory cells; and
wherein the first sinale level non-volatile memory cell has a programmed voltage that is intermediate between a higher programmed voltage for an upper page of the first multiple level non-volatile memory cell and a lower resting voltage of the first select gate.

14. The memory device of claim 13, wherein the array includes a second select gate coupled in series to an opposite end of a number of multiple level non-volatile memory cells relative to the first select gate.

15. The memory device of claim 14, wherein the array includes a second single level non-volatile memory cell interposed between and coupled to the second select gate and a second multiple level non-volatile memory cell.

16. The memory device of claim 15, wherein the second single level non-volatile memory cell has a programmed voltage that is intermediate between a higher programmed voltage for the upper page of the second multiple level non-volatile memory cell and a lower resting voltage of the second select gate.

17. A memory module, comprising:
a number of contacts;
two or more memory devices, each having access lines selectively coupled to the number of contacts; and
wherein at least one of the memory devices includes:
an array of non-volatile memory cells including a string of non-volatile memory cells;
circuitry for control and access to the array of non-volatile memory cells;
wherein the array of non-volatile memory cells includes:
a number of NAND strings of non-volatile memory cells;
a number of source select gates on a source side of a string;
a number of drain select gates on a drain side of a string; and
wherein the number of source select gates includes a number of source select gates individually coupled to a single level non-volatile memory cell, and the number of drain select gates includes a number of drain select gates individually coupled to a single level non-volatile memory cell; and
wherein the single level non-volatile memory cells individually coupled to the source select gates and the single level non-volatile memory cells individually coupled to the drain select gates are coupled to and separated by a continuous series of multiple level non-volatile memory cells ; and wherein the single level non-volatile memory cells have a programmed voltage that is intermediate between a higher programmed voltage for an upper page of the multiple level non-volatile memory cells and a lower resting voltage of the source select gates.

18. The memory module of claim 17, wherein 128 data input selections are enabled by a continuous series of 31 multiple level non-volatile memory cells coupled to a first single level non-volatile memory cell that is coupled to a source select gate, and a second single level non-volatile memory cell that is coupled to a drain select gate.

19. An electronic system, comprising:
a processor; and
a memory device coupled to the processor, wherein the memory device includes:
   an array of non-volatile memory cells including a NAND string;
   circuitry for control and access to the array of non-volatile memory cells; and
   wherein the array of non-volatile memory cells includes:
      no source select gate and no drain select gate being adjacent a multiple level non-volatile memory cell in the NAND string;
      each select gate and each drain select gate being adjacent a single level non-volatile memory cell in the NAND string;
      no multiple level non-volatile memory cell being adjacent more than one single level non-volatile memory cell in the NAND string; and
      wherein the single level non-volatile memory cells have a programmed voltage that is intermediate between a higher programmed voltage for an upper pane of the adjacent multiple level non-volatile memory cell and a lower resting voltage of the adjacent source select gate or drain select gate.

20. The electronic system of claim 19, wherein the array includes a plurality of serial NAND strings each coupled to a bit line and a plurality of rows of non-volatile memory cells.

21. A method of forming a memory array, comprising:
forming a number of series coupled non-volatile memory cells;
forming a number of series coupled select gates, wherein the series coupled select gates are coupled in series with the number of non-volatile memory cells; and
wherein forming the number of series coupled non-volatile memory cells includes forming a Cast single level non-volatile memory cell directly coupled to a first select gate and directly coupled to a first multiple level non-volatile memory cell;
wherein forming the number of series coupled non-volatile memory cells includes forming a second single level non-volatile memory cell directly coupled to a second select gate and directly coupled to a second multiple level non-volatile memory cell;
wherein forming the number of series coupled non-volatile memory cells includes forming the first multiple level non-volatile memory cell and the second multiple level non-volatile memory cell directly coupled to at least one interposed multiple level non-volatile memory cell; and
wherein forming a single level non-volatile memory cell includes forming a cell that stores a choice of two data input selections equaling one data bit and wherein forming a multiple level non-volatile memory cell includes forming a cell that stores a choice of four data input selections equaling two data bits.

22. The method of claim 21, wherein forming the number of series coupled non-volatile memory cells includes forming a number of NAND strings.

23. The method of claim 22, wherein forming each NAND string includes enabling 128 data input selections.

24. The method of claim 23, wherein enabling the 128 data input selections is done by forming 31 multiple level non-volatile memory cells coupled to the first single level non-volatile memory cell that is coupled to a source select gate and the second single level non-volatile memory cell that is coupled to a drain select gate.

25. The method of claim 22, wherein forming the number of series coupled non-volatile memory cells includes forming 31 multiple level non-volatile memory cells and two single level non-volatile memory cells in each NAND string.

26. The method of claim 21, wherein forming a single level non-volatile memory cell includes forming a cell tat stores one data bit and wherein forming a multiple level non-volatile memory cell includes forming a cell that stores a plurality of data bits.

27. A method of forming a memory block, comprising:
adding a number of word lines to a string having a number of single level non-volatile memory cells and a number of multiple level memory cells for maintaining a previous memory block size;
wherein of the number of single level non-volatile memory cells are only coupled to an edge word line associated with the string and wherein none of the number of multiple level memory cells are coupled to the edge word line;and
wherein forming a single level non-volatile memory cell includes forming a cell that stores a choice of two data input selections equaling one data bit and wherein forming a multiple level non-volatile memory cell includes forming a cell that stores a choice of four data input selections equaling two data bits.

28. The method of claim 27, wherein adding the number of word lines includes adding a number of non-volatile memory cells selected from single level non-volatile memory cells and multiple level memory cells.

29. The method of claim 28, wherein forming the memory block includes using one or more strings having a number of single level non-volatile memory cells and a number of multiple level memory cells.

30. The method of claim 29, wherein maintaining the previous memory block size includes maintaining a particular number selected from data input selection choices, memory bits, and pages associated with the previous memory block size.

31. The method of claim 30, wherein maintaining the previous memory block size includes maintaining the number of data input selection choices on a string at around 128, the number of memory bits on a string at around 64, and the number of pages in a memory block at around 128.

32. A method for operating a memory system, comprising:
applying a first select line potential to a source select gate and second select line potential to a drain select gate;
applying a first word line potential to a second non-volatile memory cell in a NAND string relative to a direction of the source gate and the drain gate that is closer, wherein the second non-volatile memory cell is a first multiple level non-volatile memory cell directly coupled to at least one additional multiple level non-volatile memory cell; and applying a second word line potential to a first non-volatile memory cell in the NAND string, which is a single level non-volatile memory cell, wherein the second word line potential is lower than the first word line potential and greater than a potential of a directly coupled select gate.

33. The method of claim 32, wherein applying a potential includes applying a third word line potential to a number of unselected non-volatile memory cells in the NAND sting.

34. A method of programming a memory array, comprising programming a single level memory cell adjacent a select gate to a programmed state, when a next adjacent multiple level memory cell is in a programmed state,
    wherein the single level non-volatile memory cell has a programmed voltage that is intermediate between a higher programmed voltage for an upper rage of the next adjacent multiple level non-volatile memory cell and a lower resting voltage of the adjacent select gate.

35. The method of claim 34, wherein programming the single level memory cell includes reducing a probability of current leakage from the programmed multiple level memory cell to the select gate adjacent the single level memory cell.

36. A method for programming a NAND flash memory device comprising a memory array having a plurality of source select gates, a plurality of drain select gates, a plurality of single level non-volatile memory cells, and a plurality of multiple level non-volatile memory cells, the method comprising:

programming the memory array such that no source select gate and no drain select gate is adjacent a multiple level non-volatile memory cell in a NAND string;
programming the memory array such that each source select gate and each drain select gate is adjacent a single level non-volatile memory cell in the NAND string,
programming the memory array such that no multiple level non-volatile memory cell is adjacent more than one single level non-volatile memory cell in the NAND string; and
wherein the single level non-volatile memory cells have a programmed voltage that is intermediate between a higher programmed voltage for an upper page of an adjacent multiple level non-volatile memory cell and a lower resting voltage of the adjacent source select gate or drain select gate.

37. The method of claim 36, wherein programming the NAND flash memory device comprises programming a memory array having a plurality of serial NAND strings each coupled to a bit line and a plurality of rows of non-volatile memory cells.

38. The method of claim 36, wherein programming the NAND flash memory device includes controlling memory operations using a memory control circuit.

39. The method of claim 38, wherein controlling memory operations comprises using a state machine as the memory control circuit.

* * * * *

UNITED STATES PATENT AND TRADEMARK OFFICE
CERTIFICATE OF CORRECTION

PATENT NO. : 7,474,560 B2 Page 1 of 1
APPLICATION NO. : 11/507408
DATED : January 6, 2009
INVENTOR(S) : Seiichi Aritome It is certified that error appears in the above-identified patent and that said Letters Patent is hereby corrected as shown below:

In column 17, line 39, in Claim 8, delete "cell ;" and insert -- cell; --, therefor.

In column 17, line 45, in Claim 8, delete "cells ;" and insert -- cells; --, therefor.

In column 18, line 23, in Claim 13, delete "sinale" and insert -- single --, therefor.

In column 18, line 63, in Claim 17, after "cell;" delete "and".

In column 19, line 2, in Claim 17, delete "cells ;" and insert -- cells; --, therefor.

In column 19, line 37, in Claim 19, delete "pane" and insert -- page --, therefor.

In column 19, line 50, in Claim 21, delete "Cast" and insert -- first --, therefor.

In column 20, line 19, in Claim 26, delete "tat" and insert -- that --, therefor.

In column 20, line 32, in Claim 27, delete "line;and" and insert -- line; and --, therefor.

In column 21, line 9, in Claim 33, delete "sting." and insert -- string. --, therefor.

In column 21, line 16, in Claim 34, delete "rage" and insert -- page --, therefor.

In column 22, line 6, in Claim 36, delete "string," and insert -- string; --, therefor.

Signed and Sealed this

Fifth Day of May, 2009

JOHN DOLL
*Acting Director of the United States Patent and Trademark Office*